(12) United States Patent
Tseng et al.

(10) Patent No.: US 12,322,450 B2
(45) Date of Patent: Jun. 3, 2025

(54) MEMORY PROGRAMMING USING CONSECUTIVE COARSE-FINE PROGRAMMING OPERATIONS OF THRESHOLD VOLTAGE DISTRIBUTIONS

(71) Applicant: Micron Technology, Inc., Boise, ID (US)

(72) Inventors: Huai-Yuan Tseng, San Ramon, CA (US); Giovanni Maria Paolucci, Milan (IT); Kishore Kumar Muchherla, Fremont, CA (US); James Fitzpatrick, Laguna Niguel, CA (US); Akira Goda, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 227 days.

(21) Appl. No.: 18/138,551

(22) Filed: Apr. 24, 2023

(65) Prior Publication Data

US 2023/0360705 A1    Nov. 9, 2023

Related U.S. Application Data

(60) Provisional application No. 63/339,902, filed on May 9, 2022.

(51) Int. Cl.
*G11C 16/34*    (2006.01)
*G11C 16/08*    (2006.01)
*G11C 16/12*    (2006.01)

(52) U.S. Cl.
CPC .............. *G11C 16/12* (2013.01); *G11C 16/08* (2013.01)

(58) Field of Classification Search
CPC .................................................. G11C 16/34
See application file for complete search history.

(56) References Cited

U.S. PATENT DOCUMENTS

2021/0174887 A1*  6/2021  Sanada .............. G11C 16/0483

* cited by examiner

*Primary Examiner* — Jason Lappas
(74) *Attorney, Agent, or Firm* — Lowenstein Sandler LLP

(57) ABSTRACT

A method includes causing a first set of memory cells, associated with a first wordline of a memory array, to be programmed with a first set of threshold voltage distributions; causing a second set of memory cells, associated with a second wordline adjacent to the first wordline, to be programmed with a second set of threshold voltage distributions; after programming the second set of cells, causing the first set of memory cells to be coarse programmed with an intermediate third set of threshold voltage distributions that is at least twice in number compared to the first set; and causing the first set of memory cells to be fine programmed with a final third set of threshold voltage distributions. At least some threshold voltage distributions of the final third set of threshold voltage distributions have wider read window margins than those of the intermediate third set of threshold voltage distributions.

20 Claims, 15 Drawing Sheets

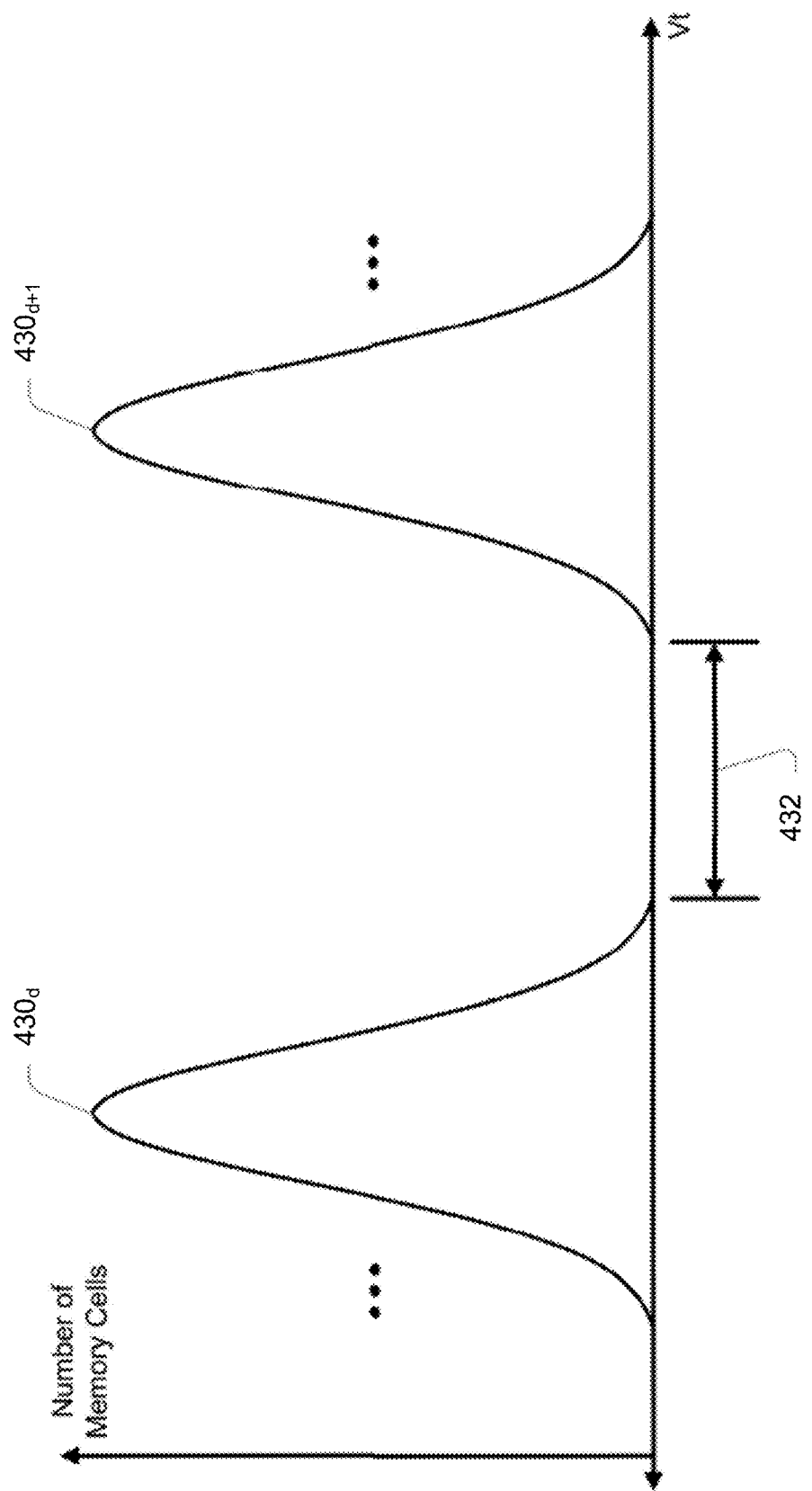

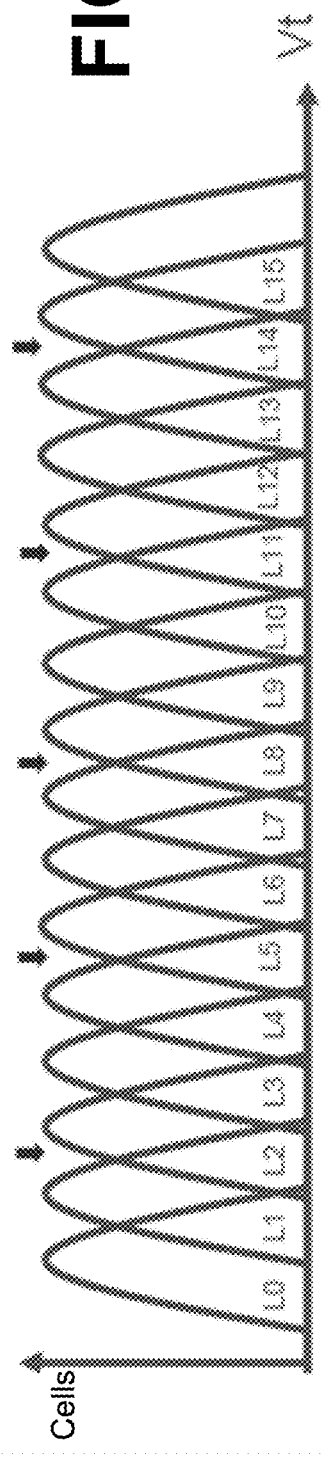
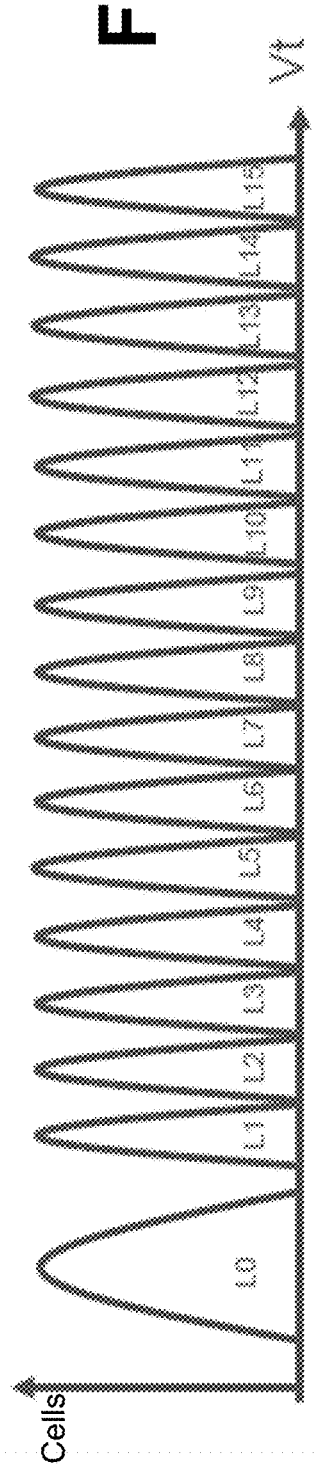
FIG. 5A
FIG. 5B

MEMORY PROGRAMMING USING CONSECUTIVE COARSE-FINE PROGRAMMING OPERATIONS OF THRESHOLD VOLTAGE DISTRIBUTIONS

REFERENCE TO RELATED APPLICATION

This application claims the benefit of U.S. Provisional Patent Application No. 63/339,902, filed May 9, 2022, the entirety of which is incorporated herein by reference.

TECHNICAL FIELD

Embodiments of the disclosure are generally related to memory sub-systems, and more specifically, relate to a memory programming using consecutive coarse-fine programming operations of threshold voltage distributions.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIG. 4 is a conceptual depiction of a threshold voltage distribution of multiple memory cells at one stage following programming for use with various embodiments.

FIG. 5A is a graph illustrating an example of a set of threshold voltage distributions, after coarse programming, that are not readable according to at least one embodiment.

FIG. 5B is a graph illustrating the example of the set of threshold voltage distributions (FIG. 5B), after fine programming, that are readable according to at least one embodiment.

DETAILED DESCRIPTION

Figure 1A:
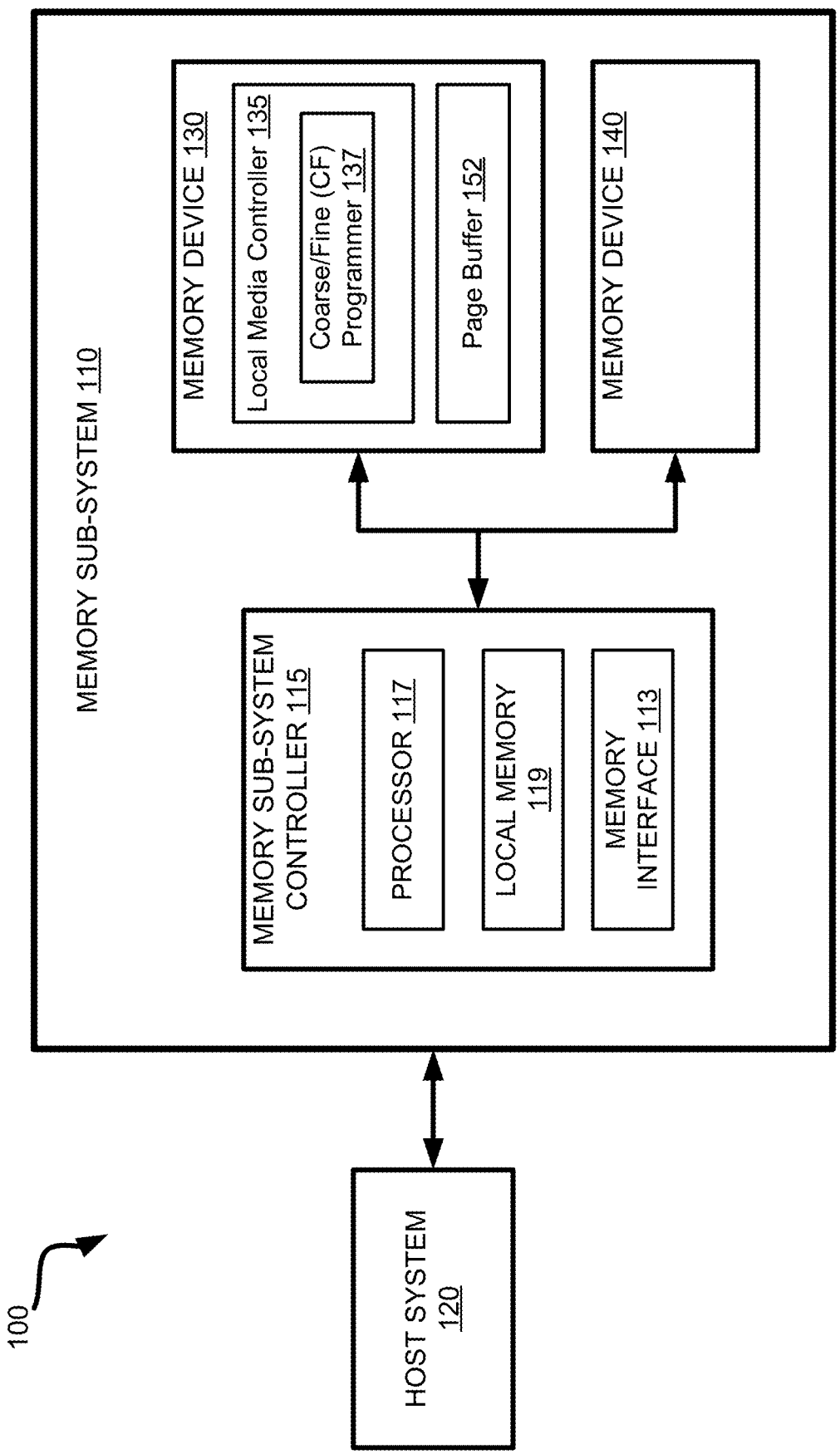
FIG. 1A illustrates an example computing system that includes a memory sub-system in accordance with some embodiments.

Embodiments of the present disclosure are directed to memory programming using consecutive coarse-fine programming operations of threshold voltage distributions. One or more memory devices can be a part of a memory sub-system, which can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1A. A non-volatile memory device is a package of one or more dies. Each die can include two or more planes. For some types of non-volatile memory devices (e.g., NAND devices), each plane includes of a set of physical blocks. In some implementations, each block can include multiple sub-blocks. Each plane carries a matrix of memory cells formed on a silicon wafer and joined by conductors referred to as wordlines (WLs) and bitlines (BLs), such that a wordline joins multiple memory cells forming a row of the matrix of memory cells, while a bitline joins multiple memory cells forming a column of the matrix of memory cells.

Depending on the cell type, each memory cell can store one or more bits of binary information, and has various logic states that correlate to the number of bits being stored. The logic states can be represented by binary values, such as "0" and "1," or combinations of such values. A memory cell can be programmed (written to) by applying a certain voltage to the memory cell, which results in an electric charge being held by the memory cell, thus allowing modulation of the voltage distributions produced by the memory cell. A set of memory cells referred to as a memory page can be programmed together in a single operation, e.g., by selecting consecutive bitlines.

Precisely controlling the amount of the electric charge stored by the memory cell allows establishing multiple logical levels, thus effectively allowing a single memory cell to store multiple bits of information. A read operation can be performed by comparing the measured threshold voltages ($V_t$) exhibited by the memory cell to one or more reference voltage levels in order to distinguish between two logical levels for single-level cell (SLCs) and between multiple logical levels for multi-level cells. A memory device can include multiple portions, including, e.g., one or more portions where the sub-blocks are configured as SLC memory and one or more portions where the sub-blocks are configured as multi-level cell (MLC) memory that can store three bits of information per cell and/or (triple-level cell) TLC memory that can store three bits of information per cell. The voltage levels of the memory cells in TLC memory form a set of 8 programming (or threshold voltage (Vt)) distributions representing the 8 different combinations of the three bits stored in each memory cell. Depending on how the memory cells are configured, each physical memory page in one of the sub-blocks can include multiple page types. For example, a physical memory page formed from single level cells (SLCs) has a single page type referred to as a lower logical page (LP). Multi-level cell (MLC) physical page types can include LPs and upper logical pages (UPs) and store two bits of information per cell. Further, TLC physical page types can include LPs, UPs, and extra logical pages (XPs) and store three bits of information per cell. Further, quad-level (QLC) physical page types can include LPs, UPs, XPs and top logical pages (TPs) and store four bits of information per cell. For example, a physical memory page formed from memory cells of the QLC memory type have a total of four logical pages, where each logical page stores data distinct from the data stored in the other logical pages associated with that physical memory page, herein referred to as a "page."

A memory device typically experiences random workloads, which can impact the threshold voltage (Vt) distributions, which can be shifted to higher or lower values. Further, read window budgets (RWBs), e.g., read window margins (FIG. 4), between threshold voltage distributions, can be impacted by cell-to-cell interference. If these read window margins are degraded from widening Vt distributions, it can be difficult to read the logical states out of the memory cells, resulting in an increased read bit error rate (RBER). Cell-to-cell interference occurs when a next logical program of memory cells (e.g., coupled with WLn+1) causes the threshold voltage (Vt) distribution of victim memory cells (e.g., coupled with WLn) to widen, thus degrading the read window margins between Vt distributions of the WLn victim memory cells. In this scenario, the memory cells associated with WLn+1 are physically adjacent to (e.g., above) the memory cells associated with WLn. This cell-to-cell interference imparted to the WLn memory cells is a function of the WLn+1 aggressor memory cells incurring a threshold voltage (Vt) swing when being programmed from an erase state to a set of threshold voltage distributions.

Thus, to minimize cell-to-cell interference, certain memory devices perform a coarse-fine programming algorithm, in which the WLn memory cells first undergo a coarse programming that results in unreadable Vt distributions (FIG. 5A). Then, later, after the WLn+1 aggressor memory cells have also been coarse programmed, the WLn memory cells are fine programmed. When this alternating nature of coarse-to-fine programming across wordlines is followed to store a page of data along WLn and another page of data along WLn+1, final read window margins of a set of threshold voltage distributions become readable (FIG. 5B). In this way, there is a transition by the WLn+1 aggressor memory cells being programmed from an erased Vt distribution to a coarse set of Vt distributions instead of going directly from the erased Vt distribution to the final set of fine Vt distributions, enabling reduction in the cell-to-cell interference as programming progresses due to incurring smaller Vt swings with each programming operation. With a coarse-fine programming algorithm, for example, read window margins for QLC-programmed memory cells can be significantly improved to achieve maximum bits-per-cell for bit-cost scaling. Further, this coarse-fine programming algorithm can help reduce quick charge loss (QCL), which is also referred to as temporal voltage shift, by reducing programmed Vt swings of memory cells.

A challenge that comes with the coarse-fine programming algorithm, however, is that a significant amount of SLC memory is dedicated to buffer QLC data that is being programmed, incurring additional hardware costs. This buffering of data is required because coarse-programmed Vt distributions have heavily-overlapped states (FIG. 5A), and thus are unreadable while waiting to undergo fine programming into final Vt distributions that are readable (FIG. 5B). Thus, the QLC data is first buffered in SLC blocks of memory so the QLC data is available for the fine programming. More specifically, according to one coarse-fine programming algorithm of QLC memory, at least 5 coarse QLC pages of data (or approximately 20 SLC pages of data) to be programmed across two adjacent wordlines need to be buffered in SLC blocks.

Figure 6:
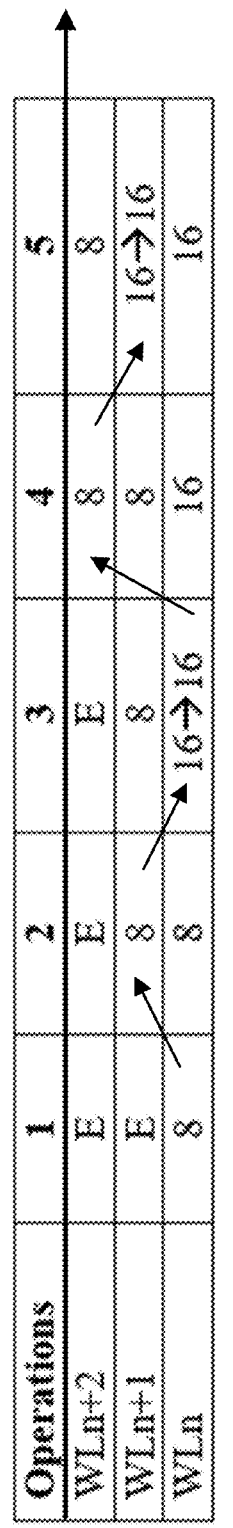
FIG. 6 is a graph illustrating consecutive programming operations that includes the consecutive coarse programming followed by fine programing of a set of threshold voltage distributions according to an embodiment.

Aspects of the present disclosure address the above and other deficiencies through modifying the coarse-fine programming algorithm so that the initial programming operation is of a smaller number of Vt distributions. For purposes of explanation, assume the memory device is ultimately programming QLC memory, and thus a final set of Vt distributions are 16 in number. By programming the memory cells with a smaller number of Vt distributions, e.g., as TLC memory, the 8 Vt distributions of programmed TLC memory can be read (FIG. 6). This eliminates the need for additional SLC buffer and, consequently, the additional hardware cost involved with the coarse-fine programming.

An additional challenge with this modified coarse-fine programming algorithm is that the RWBs or read voltage margins are again degraded (narrowed) to some degree due to the larger threshold voltage (Vt) shifts of transitioning from fewer Vt distributions (e.g., in TLC) to a greater number of Vt distribution (e.g., in QLC). In various embodiments, in order to widen the read voltage margins back out, the memory device instead performs consecutive (or back-to-back) coarse and fine programming operations for the higher number of Vt distributions, e.g., programmed as QLC memory. Due to the progressive nature of the programming, e.g., that TLC programming is faster than QLC programming and TLC-to-QLC programming is also faster than QLC programming, the overall program time (tPROG) penalty due to the extra coarse programming operation is not large. Thus, the program time penalty is an acceptable tradeoff.

Therefore, advantages of the systems and methods implemented in accordance with some embodiments of the present disclosure include, but are not limited to, providing a more gradual Vt shift between programming a lower number of (e.g., TLC) Vt distributions and fine programming a higher number of (e.g., QLC) VT distributions, increasing read window margins between the final (e.g. QLC) Vt distributions. The use of consecutive coarse and fine programming operations at the completion of programming a set of memory cells also reduces program noise by employing a Vt touch-up effect that occurs between the coarse and fine programming. Also, this Vt touch-up effect also reduces quick charge loss (QCL), improving RBER of the programmed memory cells particularly during time periods directly after programming. Other advantages will be apparent to those skilled in the art of multi-level cell programming, which will be discussed hereinafter.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. The host system 120 can provide data to be stored at the memory sub-system 110 and can request data to be retrieved from the memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple-level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage a memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In at least one embodiment, memory device 130 includes a memory access manager configured to carry out memory access operations, e.g., in response to receiving memory access commands from memory interface 113. In some implementations, local media controller 135 includes at least a portion of memory access manager and is configured to perform the functionality described herein. In some implementations, the memory access manager is implemented on memory device 130 using firmware, hardware components, or a combination of the above. In an illustrative example, the memory access manager receives, from a requestor, such as memory interface 113, a request to read a data page of the memory device 130. A read operation can include a series of read strobes, such that each strobe applied a certain read level voltage to a chosen wordline of a memory device 130 in order to compare the estimated threshold voltages $V_t$ of a set of memory cells to one or more read levels corresponding to the expected positions of the voltage distributions of the memory cells.

In some embodiments, the memory device 130 includes a page buffer 152, which can provide the circuitry used to program data to the memory cells of the memory device 130 and to read the data out of the memory cells. In some embodiments, control logic of the local media controller 135 includes a coarse/fine (CF) programmer 137 that can implement or direct the consecutive coarse and fine programming operations on a set of memory cells and other related operations described herein. In some embodiments, this control logic is integrated in whole or in part within the memory sub-system controller 115 and/or the host system 120.

Figure 1B:
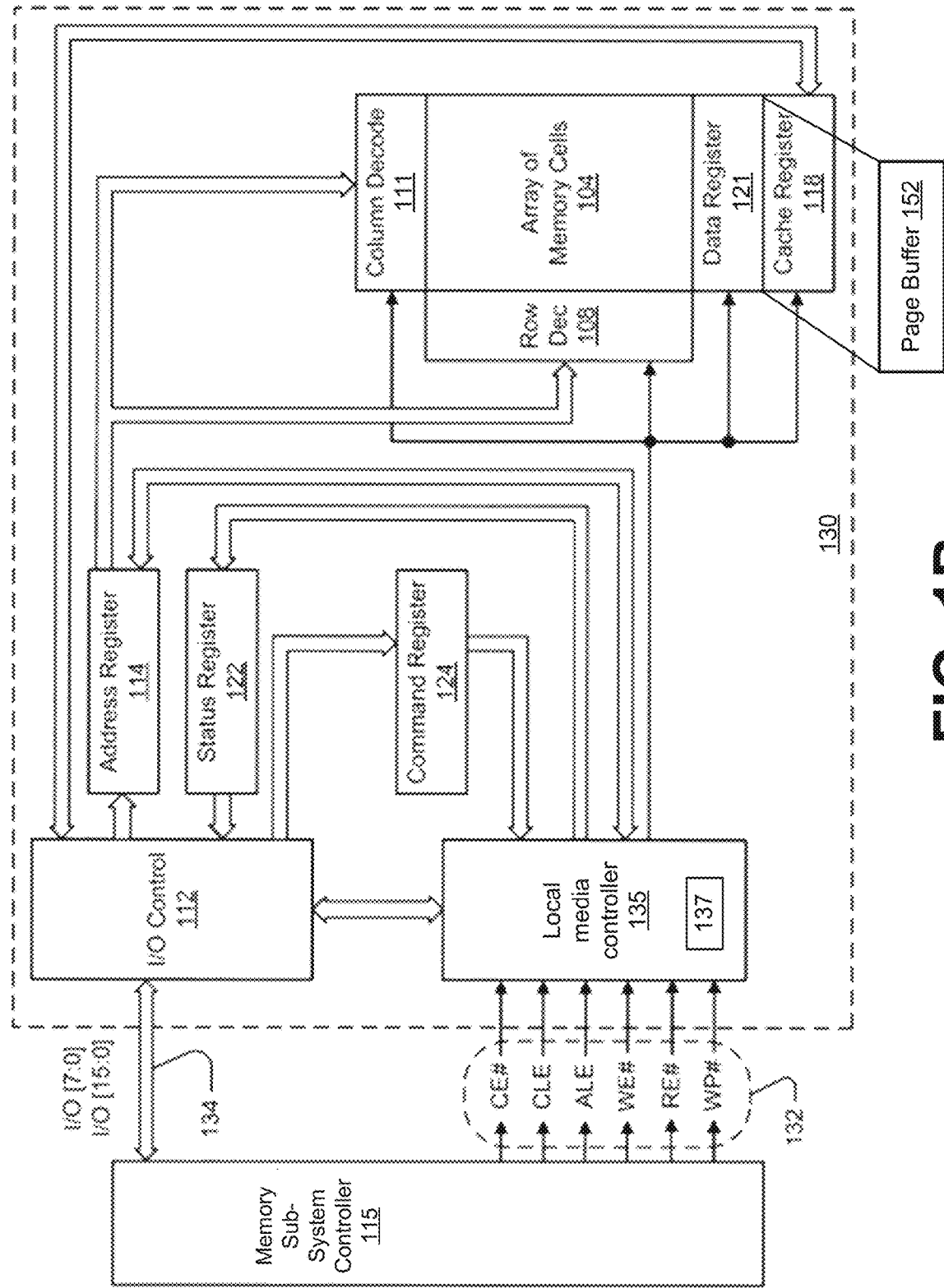
FIG. 1B is a block diagram of a memory device in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., the memory sub-system 110 of FIG. 1A), according to an embodiment.

Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

The memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bitline). A single access line can be associated with more than one logical row of memory cells and a single data line can be associated with more than one logical column. Memory cells (not shown in FIG. 1B) of at least a portion of the array of memory cells 104 are capable of being programmed to one of at least two target data states.

Row decode circuitry 108 and column decode circuitry 111 are provided to decode address signals. Address signals are received and decoded to access the array of memory cells 104. The memory device 130 also includes input/output (I/O) control circuitry 112 to manage input of commands, addresses and data to the memory device 130 as well as output of data and status information from the memory device 130. An address register 114 is in communication with the I/O control circuitry 112 and row decode circuitry 108 and column decode circuitry 111 to latch the address signals prior to decoding. A command register 124 is in communication with the I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 111 to control the row decode circuitry 108 and column decode circuitry 111 in response to the addresses.

The local media controller 135 is also in communication with a cache register 118 and a data register 121. The cache register 118 latches data, either incoming or outgoing, as directed by the local media controller 135 to temporarily store data while the array of memory cells 104 is busy writing or reading, respectively, other data. During a program operation (e.g., write operation), data can be passed from the cache register 118 to the data register 121 for transfer to the array of memory cells 104; then new data can be latched in the cache register 118 from the I/O control circuitry 112. During a read operation, data can be passed from the cache register 118 to the I/O control circuitry 112 for output to the memory sub-system controller 115; then new data can be passed from the data register 121 to the cache register 118. The cache register 118 and/or the data register 121 can form (e.g., can form at least a portion of) the page buffer 152 of the memory device 130. The page buffer 152 can further include sensing devices such as a sense amplifier, to sense a data state of a memory cell of the array of memory cells 104, e.g., by sensing a state of a data line connected to that memory cell. A status register 122 can be in communication with I/O control circuitry 112 and the local memory controller 135 to latch the status information for output to the memory sub-system controller 115.

The memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands can be received over input/output (I/O) pins [7:0] of I/O bus 134 at I/O control circuitry 112 and can then be written into a command register 124. The addresses can be received over input/output (I/O) pins [7:0] of I/O bus 134 at I/O control circuitry 112 and can then be written into address register 114. The data can be received over input/output (I/O) pins [7:0] for an 8-bit device or input/output (I/O) pins [15:0] for a 16-bit device at I/O control circuitry 112 and then can be written into cache register 118. The data can be subsequently written into data register 121 for programming the array of memory cells 104.

In an embodiment, cache register 118 can be omitted, and the data can be written directly into data register 121. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) can be used in the various embodiments.

Figure 2A:
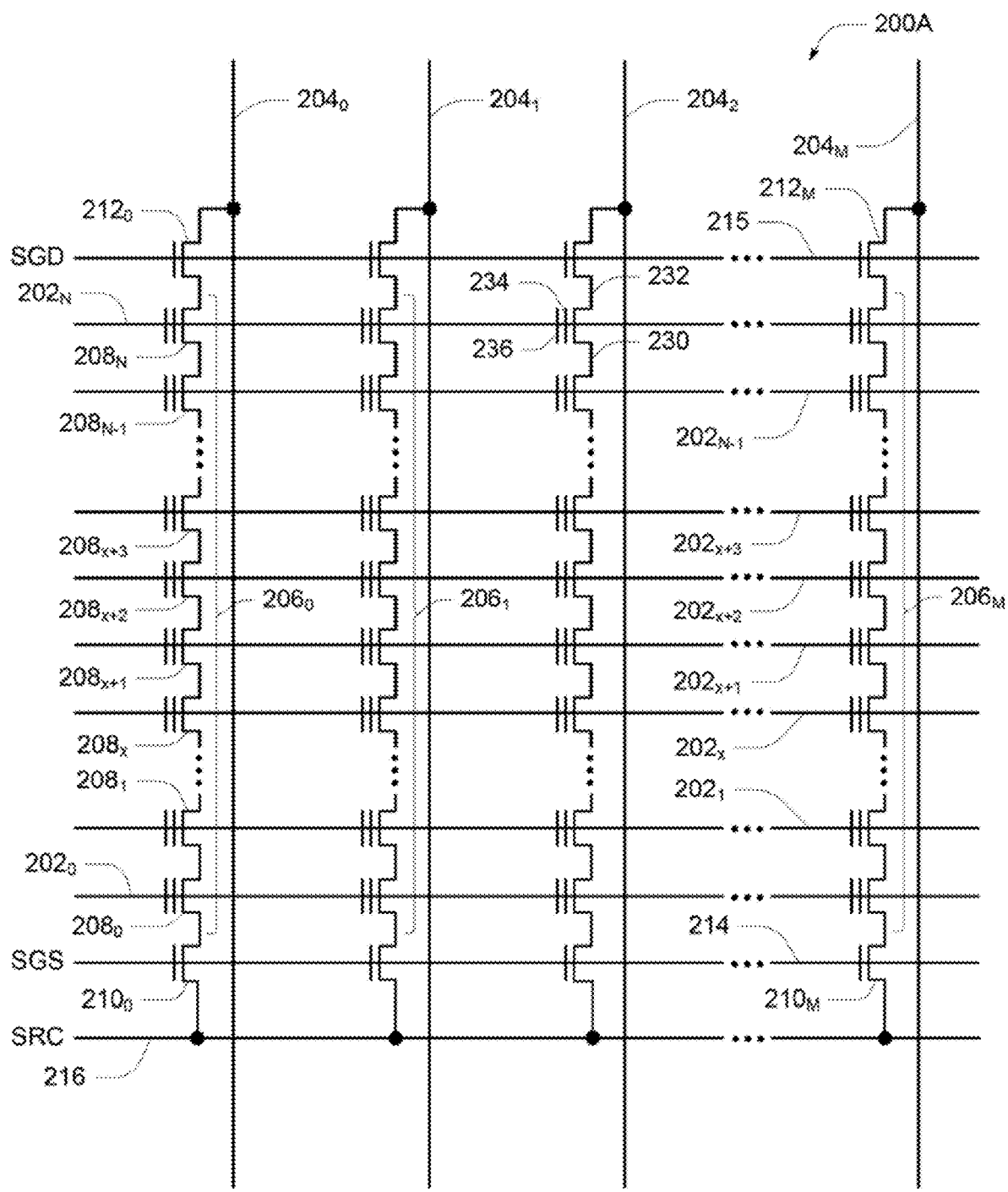
FIG. 2A-2B are schematics of portions of an array of memory cells as could be used in a memory of the type described with reference to FIG. 1B according to an embodiment.
Figure 2B:
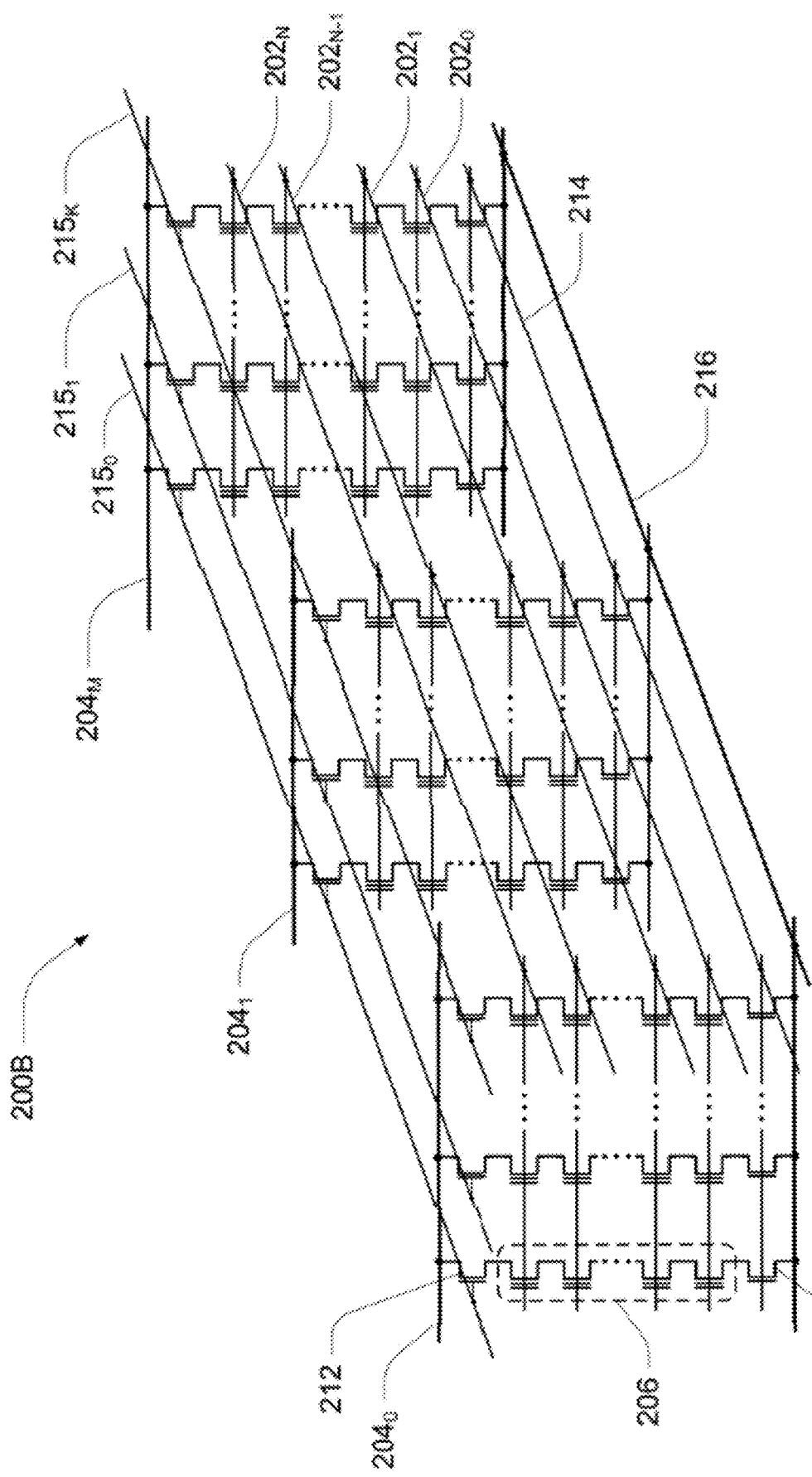

FIG. 2A-2B are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as wordlines $202_0$ to $202_N$, and data lines, such as bitlines $204_0$ to $204_M$. The wordlines 202 can be connected to global access lines (e.g., global wordlines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a wordline 202) and columns (each corresponding to a bitline 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bitline 204 for the corresponding NAND string 206. For example, the drain of select gate $212_0$ can be connected to the bitline $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bitline 204. A control gate of each select gate 212 can be connected to select line 215.

The memory array 200A in FIG. 2A can be a quasi-two-dimensional memory array and can have a generally planar structure, e.g., where the common source 216, NAND strings 206 and bitlines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bitlines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bitline 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bitlines 204 (e.g., bitlines $204_0$, $204_2$, $204_4$, etc.) can be one physical page of the memory cells 208 (e.g., even memory cells) while memory cells 208 commonly connected to wordline $202_N$ and selectively connected to odd bitlines 204 (e.g., bitlines $204_1$, $204_3$, $204_5$, etc.) can be another physical page of the memory cells 208 (e.g., odd memory cells).

Although bitlines $204_3$-$204_5$ are not explicitly depicted in FIG. 2A, it is apparent from the figure that the bitlines 204 of the array of memory cells 200A can be numbered consecutively from bitline $204_0$ to bitline $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bitline $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bitline 204. Subsets of NAND strings 206 can be connected to their respective bitlines 204 by biasing the select lines $215_0$-$215_K$ to selectively activate particular select transistors 212 each between a NAND string 206 and a bitline 204. The select transistors 210 can be activated by biasing the select line 214. In some embodiments, each sub-block or string of memory cells has a separate select line 214 from other sub-blocks or strings. In some embodiments, a pair of sub-blocks shares a select line 214. Each wordline 202 can be connected to multiple rows of memory cells of the memory array 200B. Rows of memory cells that are commonly connected to each other by a particular wordline 202 can collectively be referred to as tiers.

Figure 3:
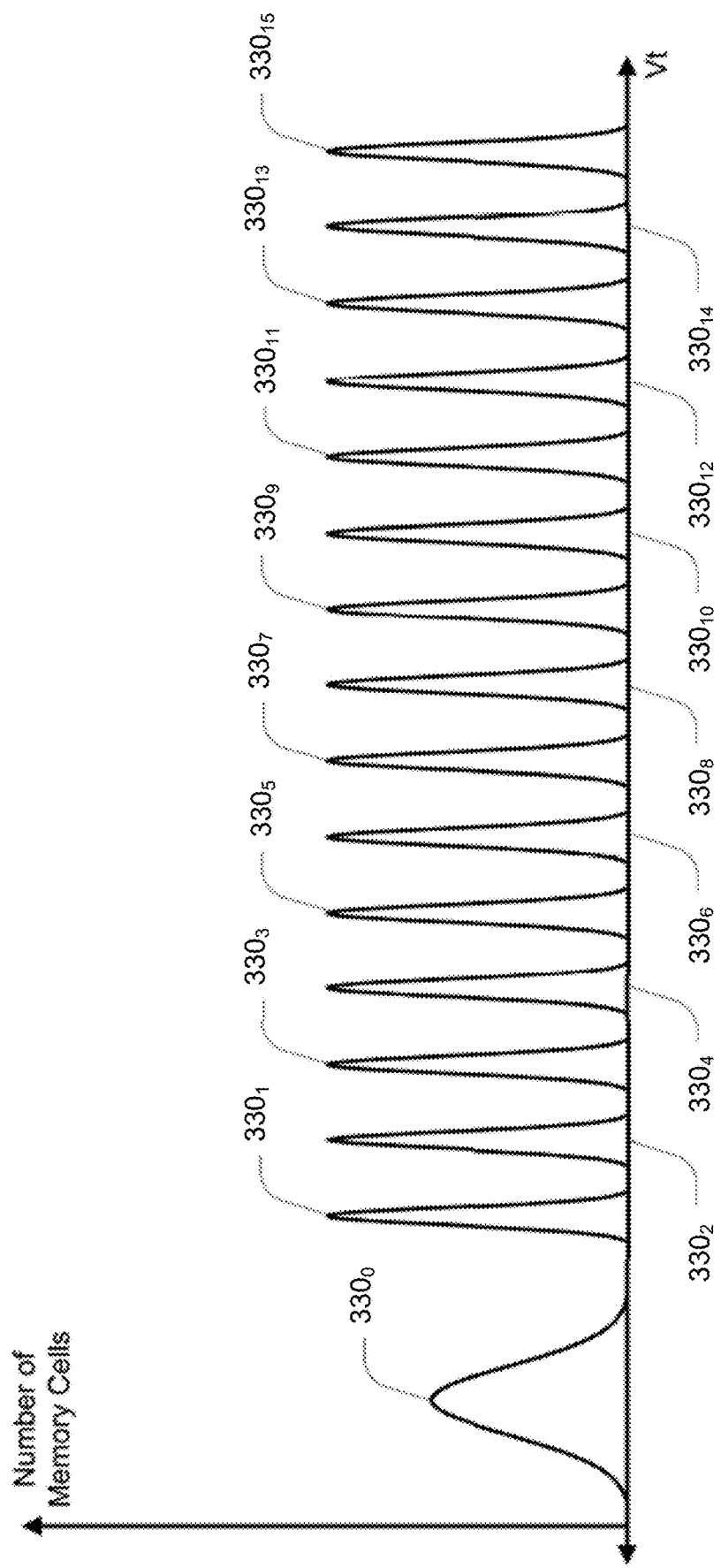
FIG. 3 is a conceptual depiction of threshold voltage distributions of multiple memory cells of a memory array according to an embodiment.

FIG. 3 is a conceptual depiction of threshold voltage ranges of multiple memory cells. FIG. 3 illustrates an example of threshold voltage ranges and their distributions for a population of a sixteen-level memory cells, e.g., QLC memory cells. For example, such a memory cell can be programmed to a threshold voltage (Vt) that falls within one of sixteen different threshold voltage ranges $330_0$-$330_{15}$, each being used to represent a data state corresponding to a bit pattern of four bits. The threshold voltage range $330_0$ typically has a greater width than the remaining threshold voltage ranges $330_1$-$330_{15}$ as memory cells are generally all placed in the data state corresponding to the threshold voltage range $330_0$, then subsets of those memory cells are subsequently programmed to have threshold voltages in one of the threshold voltage ranges $330_1$-$330_{15}$. As programming operations are generally more incrementally controlled than erase operations, these threshold voltage ranges $330_1$-$330_{15}$ can tend to have tighter distributions.

TABLE 1

| Data State | Logical Data Value |
|---|---|
| L0 | 1111 |
| L1 | 0111 |
| L2 | 0011 |
| L3 | 1011 |
| L4 | 1001 |
| L5 | 0001 |
| L6 | 0101 |
| L7 | 1101 |
| L8 | 1100 |
| L9 | 0100 |
| L10 | 0000 |
| L11 | 1000 |
| L12 | 1010 |
| L13 | 0010 |
| L14 | 0110 |
| L15 | 1110 |

The threshold voltage ranges $330_0$, $330_1$, $330_2$, $330_3$, $330_4$, $330_5$, $330_6$, $330_7$, $330_8$, $330_9$, $330_{10}$, $330_{11}$, $330_{12}$, $330_{13}$, $330_{14}$, and $330_{15}$ can each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges $330_0$, the memory cell in this case can be storing a data state L0 having a data value of logical '1111' and is typically referred to as the erased state of the memory cell. If the threshold voltage is within the second of the sixteen threshold voltage ranges $330_1$, the memory cell in this case can be storing a data state L1 having a data value of logical '0111'. If the threshold voltage is within the third of the sixteen threshold voltage ranges $330_2$, the memory cell in this case can be storing a data state L2 having a data value of logical '0011,' and so on. Table 1 provides one possible correspondence between the data states and their corresponding logical data values. Other assignments of data states to logical data values are known or can be envisioned. Memory cells remaining in the lowest data state (e.g., the erased state or L0 data state), as used herein, will be deemed to be programmed to the lowest data state.

FIG. 4 is a conceptual depiction of a threshold voltage distribution of multiple memory cells following a programming operation. The threshold voltage distributions $430_d$-$430_{d+1}$ of FIG. 4 can represent some portion of the distributions for threshold voltage ranges $330_0$-$330_{15}$ of FIG. 3 at the completion of a programming operation for memory cells. With reference to FIG. 4, adjacent threshold voltage distributions 430 are typically separated by some read window margin 432 (e.g., dead space) at the completion of programming. Applying a sense voltage (e.g., read level voltage) within the read window margin 432 to the control gates of the multiple memory cells can be used to distinguish between the memory cells of the threshold voltage distribution $430_d$ (and any lower threshold voltage distribution) and the memory cells of the threshold voltage distribution $430_{d+1}$ (and any higher threshold voltage distribution).

Due to the phenomenon known as slow charge loss (SCL), the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage is changing rapidly at first (immediately after the memory cell was programmed, referred to as quick charge loss (QLC)), and then slows down in an approximately logarithmic linear fashion with respect to the time elapsed since the cell programming event. This temporal voltage shift, if left unadjusted, reduces the read window margin 432 between the threshold voltage distributions $430_d$-$430_{d+1}$ over time, and can cause these threshold voltage distributions to overlap, making it more difficult to distinguish between adjacent threshold voltage distributions. Accordingly, failure to mitigate the temporal voltage shift caused by the slow charge loss can result in the increased bit error rate in read operations, which the consecutive coarse-fine programming operations described herein is intended to mitigate.

FIG. 5A is a graph illustrating an example of a set of threshold voltage distributions, after coarse programming, that are not readable according to at least one embodiment. Coarse programming can be compared to initial pass programming in which the Vt distributions are highly overlapped when coarse programming many Vt distributions, e.g. as is the case in programming QLC memory. Due to this overlapping of the Vt distributions, the coarse-programmed sets of threshold Vt distributions may also be referred to herein as intermediate Vt distributions. This overlapping occurs due to less precise programming in which each Vt distribution widely covers a range of threshold voltage that coarsely approximates a more accurate (finer) threshold voltage range that is intended for each respective Vt distribution.

FIG. 5B is a graph illustrating the example of the set of threshold voltage distributions (FIG. 5B), after fine programming, that are readable according to at least one embodiment. When fine programming is completed, e.g., to a final set of Vt distributions, each Vt distribution is more finely defined over a focused threshold voltage range intended for each respective logical state. When this occurs, the read window margins between respective Vt distributions are widened such that individual logical states across different memory cells of a set of memory cells can be distinguished when read.

While the overlap between coarsely-programmed Vt distributions is more pronounced in QLC programming, the disclosed consecutive coarse and fine programming operations can be performed on differing types of memory where coarse programming can initially be carried out in a fewer number of intermediate Vt distributions followed by consecutive coarse and fine programming of a larger number of final Vt distributions, as will be discussed. Also, as was mentioned, the touch-up effect of performing fine programming on the set of memory cells after a coarse programming of the same number of Vt distributions leads to improved read window margins (or RWB) and QCL.

Figure 7:
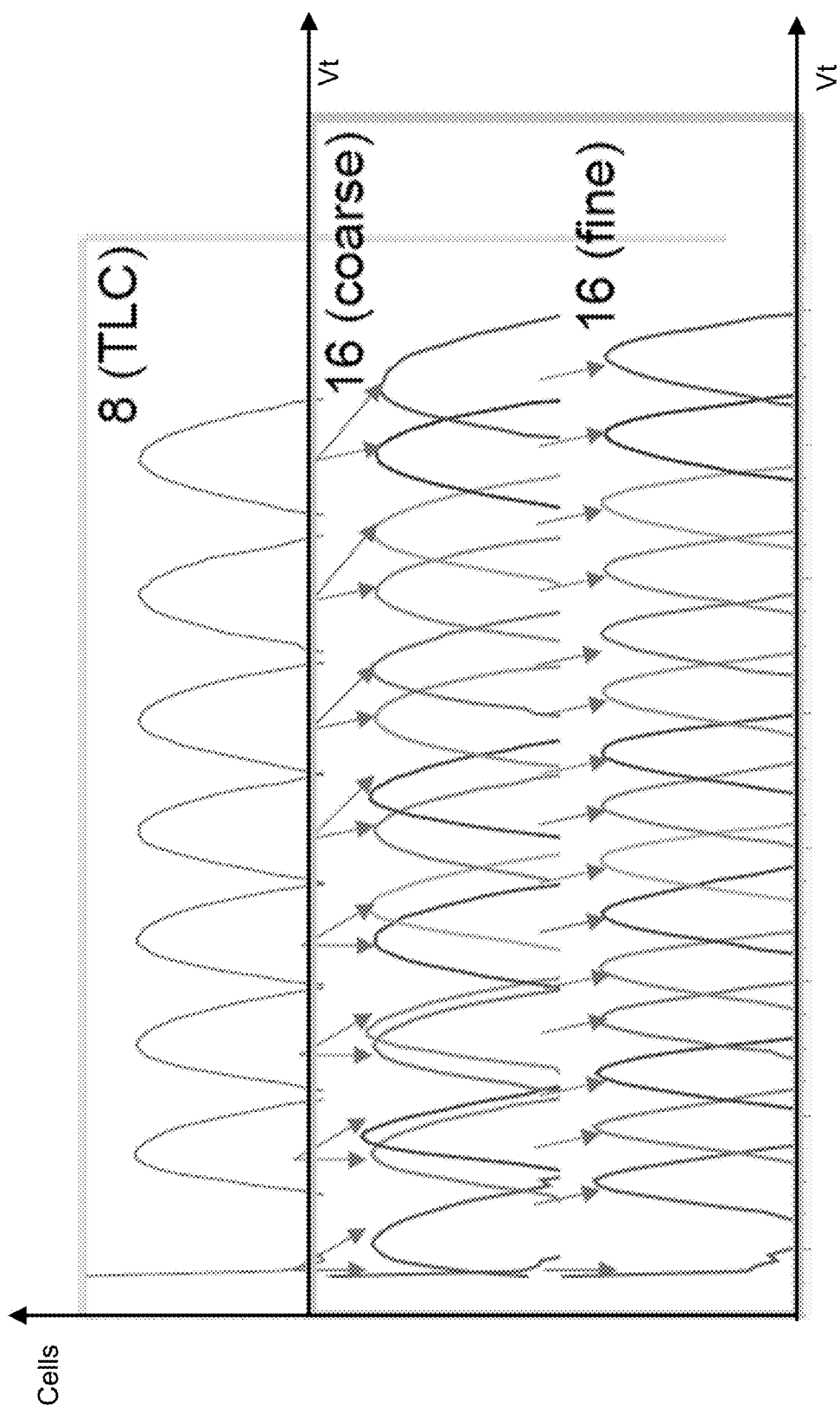
FIG. 7 is a graph depicting an example series of programming operations on a set of memory cells that involves a consecutive coarse programming followed by fine programing of a set of threshold voltage distributions according to an embodiment.

FIG. 6 is a graph illustrating consecutive programming operations that includes the consecutive coarse programming followed by fine programing of a set of threshold voltage distributions according to an embodiment. These operations can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the operations are performed by the local media controller 135 (e.g., control logic) of FIGS. 1A-1B, e.g., by the CF programmer 137, on a memory array that includes a plurality of memory cells electrically coupled to a plurality of wordlines and a plurality of bitlines. FIG. 7 is a graph depicting an example series of programming operations on a set of memory cells that involves a consecutive coarse programming followed by fine programing of a set of threshold voltage distributions according to an embodiment.

As illustrated, this consecutive coarse and fine programming is described in relation to adjacent, sequential wordlines (WLs), e.g., a first wordline (WLn), a second wordline (WLn+1) adjacent to the first wordline, and a third wordline (WLn+2) adjacent to the second wordline. The programming is illustrated as a series numbered operations that are sequentially performed in an alternating fashion across these adjacent wordlines. The letter "E" refers to an erase distribution, e.g., being in an erased state. Programming is proceeding from the first wordline, to the second wordline, and then to the third wordline. To retain simplicity in explanation, assume the programming illustrated in FIG. 6 is performed within a single sub-block of the memory array.

At a first operation, the processing logic causes a first set of memory cells associated with the first wordline (WLn) to be programmed from an erase distribution to a first set of threshold voltage distributions while a second set of memory cells associated with the second wordline (WLn+1) and a third set of memory cells associated with the third wordline (WLn+2) remain at an erase distribution or in an erased state. In this example embodiment, this initial programming results in the first set of threshold voltage distributions that are fewer in number than final intended programmed Vt distributions. By way of example, if QLC programming is intended, the first set of threshold voltage distributions are TLC or 8 Vt distributions, as illustrated at the top of the graph of FIG. 7. As will be discussed with reference to FIG. 9, the initial programming may start with SLC and/or MLC programming as well, before progressing to TLC programming before the consecutive coarse and fine QLC programming.

At a second operation, the processing logic causes a second set of memory cells, associated with the second wordline (WLn+1) that is adjacent to the first wordline (WLn), to be programmed from an erase distribution to a second set of threshold voltage distributions. In this embodiment, the second set of threshold voltage distributions also includes TLC distributions. In various embodiments, the first set of threshold voltage distributions includes one of multi-level cell (MLC) or triple-level cell (TLC) threshold voltage distributions.

In an alternating fashion, at a third operation, the processing logic performs the consecutive coarse and fine programming of the first set of memory cells to a third set of threshold voltage distributions, e.g., in this embodiment as QLC threshold voltage distributions. More specifically, after programming the second set of memory cells, the processing logic causes the first set of memory cells to be coarse programmed with an intermediate third set of threshold voltage distributions (e.g., QLC threshold voltage distributions) that is at least twice in number compared to the first set of threshold voltage distributions (e.g., TLC threshold voltage distributions). Results of the coarse programming portion of the third operation is shown in the middle of the graph of FIG. 7 according to an embodiment. The processing logic further also causes the first set of memory cells to be fine programmed with a final third set of threshold voltage distributions. Results of the fine programming portion of the third operation is illustrated at the bottom of the graph of FIG. 7 according to an embodiment. As a result of the fine programming, at least some threshold voltage distributions of the final third set of threshold voltage distributions have wider read window margins than those of the intermediate third set of threshold voltage distributions. Further, at least some of the final third set of Vt distributions may also be shifted to higher threshold voltage ranges compared to those of the intermediate third set of Vt distributions.

Continuing the alternating nature of programming, at a fourth operation, after causing the first set of memory cells to be fine programmed, the processing logic causes a third set of memory cells, associated with a third wordline that is adjacent to the second wordline, to be programmed with a fourth set of threshold voltage distributions.

At a fifth operation, the processing logic causes another consecutive coarse and fine programming of the second set of memory cells. More specifically, after programming the third set of memory cells, the processing logic causes the second set of memory cells to be coarse programmed with an intermediate fifth set of threshold voltage distributions that is at least twice in number compared to the second set of threshold voltage distributions. Further, the processing logic causes the second set of memory cells to be fine programmed with a final fifth set of threshold voltage distributions. At least some threshold voltage distributions of the final fifth set of threshold voltage distributions have wider read window margins than those of the intermediate fifth set of threshold voltage distributions. Further, at least some of the final fifth set of Vt distributions may also be shifted to higher threshold voltage ranges compared to those of the intermediate fifth set of Vt distributions. These operations can continue in alternating fashion to the third wordline and so forth to additional adjacent wordlines sequentially across the sub-block of the memory array.

Further, while the embodiments of FIG. 6-7 are illustrated as TLC to QLC programming, the present embodiments can be extended within future memory technology that may store a possible five bits per memory cell. In such an extension, for example, initial programming might flow from SLC, to MLC, to TLC, to QLC, and ultimately to consecutive coarse and fine programming of 5 bit level threshold voltage distributions.

Figure 8:
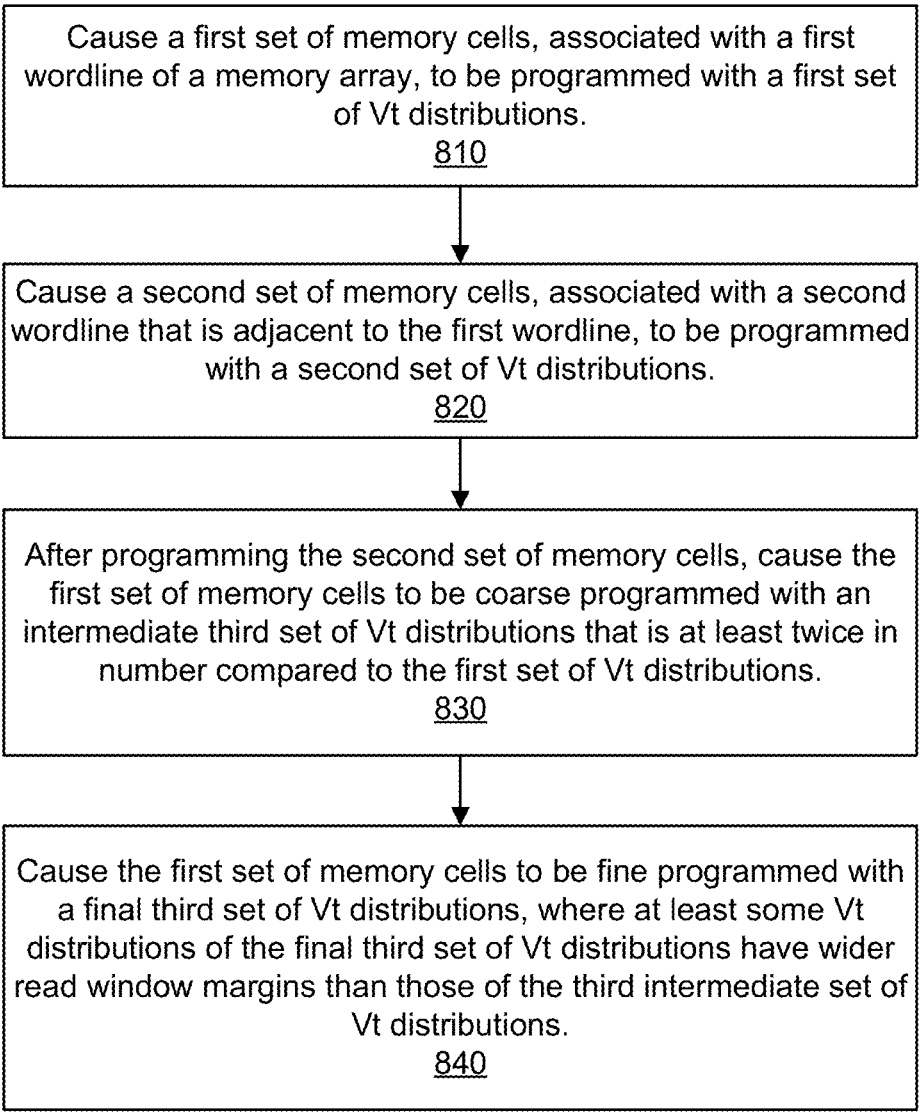
FIG. 8 is a flow diagram of an example method of consecutively coarse programming followed by fine programming a set of threshold voltage distributions according to various embodiments.

FIG. 8 is a flow diagram of an example method 800 of consecutively coarse programming followed by fine programming a set of threshold voltage distributions according to various embodiments. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the local media controller 135 (e.g., control logic) of FIGS. 1A-1B, e.g., by the CF programmer 137, on a memory array that includes a plurality of memory cells electrically coupled to a plurality of wordlines and a plurality of bitlines. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, a first set of memory cells is programmed. More specifically, the processing logic causes a first set of memory cells, associated with a first wordline of a memory array, to be programmed with a first set of threshold voltage distributions.

At operation 820, a second set of memory cells is programmed. More specifically, the processing logic causes a second set of memory cells, associated with a second wordline that is adjacent to the first wordline, to be programmed with a second set of threshold voltage distributions.

At operation 830, a further coarse programming is performed on the first set of memory cells. More specifically, after programming the second set of memory cells, the processing logic causes the first set of memory cells to be coarse programmed with an intermediate third set of threshold voltage distributions that is at least twice in number compared to the first set of threshold voltage distributions.

At operation 840, a fine programming is performed on the first set of memory cells. More specifically, the processing logic causes the first set of memory cells to be fine programmed with a final third set of threshold voltage distributions, where at least some threshold voltage distributions of the final third set of threshold voltage distributions have wider read window margins than those of the intermediate third set of threshold voltage distributions. Further, at least some of the final third set of Vt distributions may also be shifted to higher threshold voltage ranges compared to those of the intermediate third set of Vt distributions.

Figure 9A:
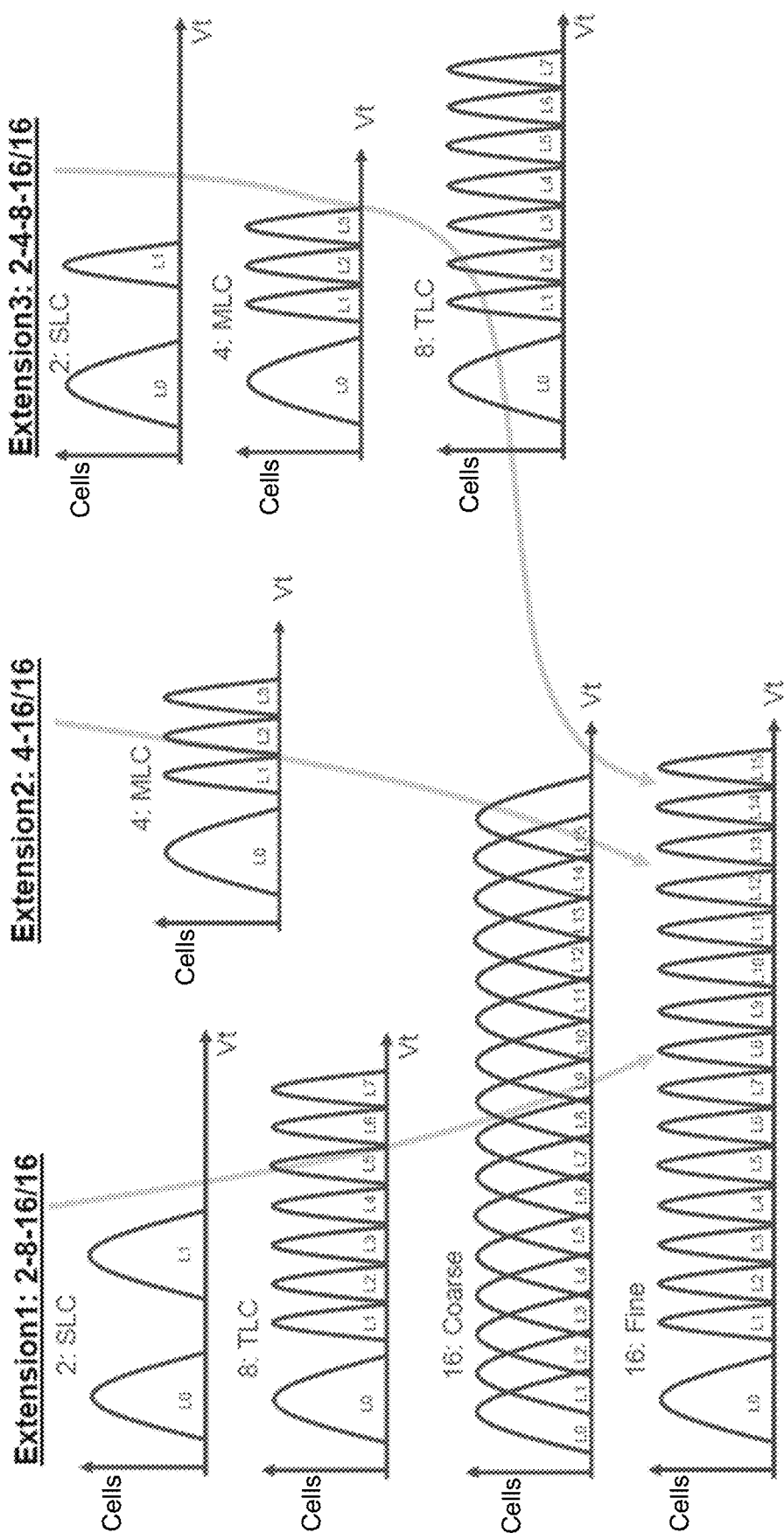
FIG. 9A is a set of graphs illustrating various alternative programming sequences that can all end in consecutive coarse programming followed by fine programing of a set of threshold voltage distributions to a group of quad-level cells (QLCs) according to various embodiments.

FIG. 9A is a set of graphs illustrating various alternative programming sequences that can all end in consecutive coarse programming followed by fine programing of a set of threshold voltage distributions to a group of quad-level cells (QLCs) according to various embodiments. In these alternative embodiments, the processing (or control) logic causes the first set of memory cells to be programmed with an initial set of threshold voltage distributions before causing the first set of memory cells to be programmed with the first set of threshold voltage distributions.

In a first extension to the embodiments of FIGS. 6-8, the processing logic first causes the first set of memory cells to be programmed with SLC threshold voltage distributions, followed causing the first set of memory cells to be programmed with TLC threshold voltage distributions, followed by causing the consecutive coarse and fine programming of the first set of memory cells with QLC threshold voltage distributions.

In a second extension to the embodiments of FIGS. 6-8, the processing logic causes the first set of memory cells to be programmed with MLC threshold voltage distributions, followed by causing the consecutive coarse and fine programming of the first set of memory cells with QLC threshold voltage distributions.

In a third extension to the embodiments of FIGS. 6-8, the processing logic first causes the first set of memory cells to be programmed with SLC threshold voltage distributions, followed by causing the first set of memory cells to be programmed with MLC threshold voltage distributions, followed by causing the first set of memory cells to be programmed with TLC threshold voltage distributions, followed by causing the consecutive coarse and fine programming of the first set of memory cells with QLC threshold voltage distributions.

Figure 9B:
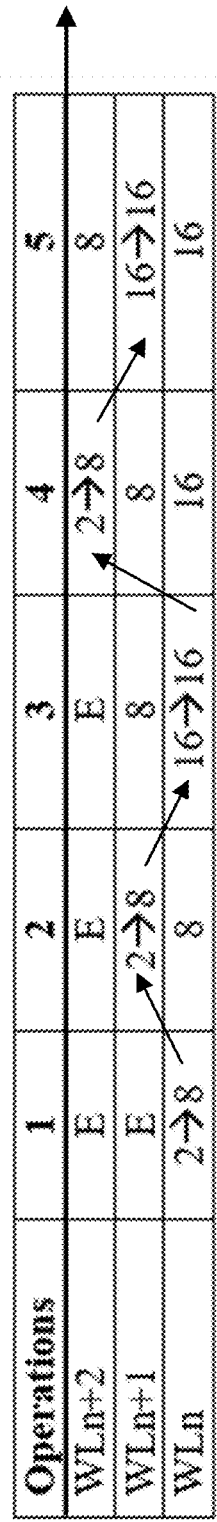
FIGS. 9B-9D are graphs illustrating consecutive programming operations that includes the consecutive coarse programming followed by fine programing of a set of threshold voltage distributions associated with the alternative programming sequences of FIG. 9A according to various embodiments.
Figure 9C:
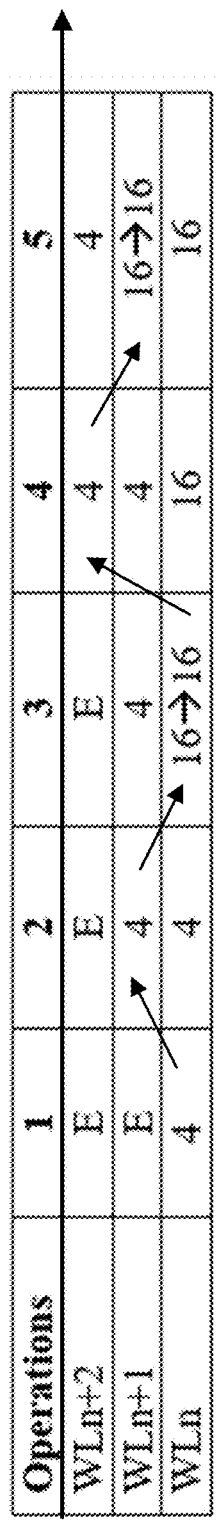
Figure 9D:
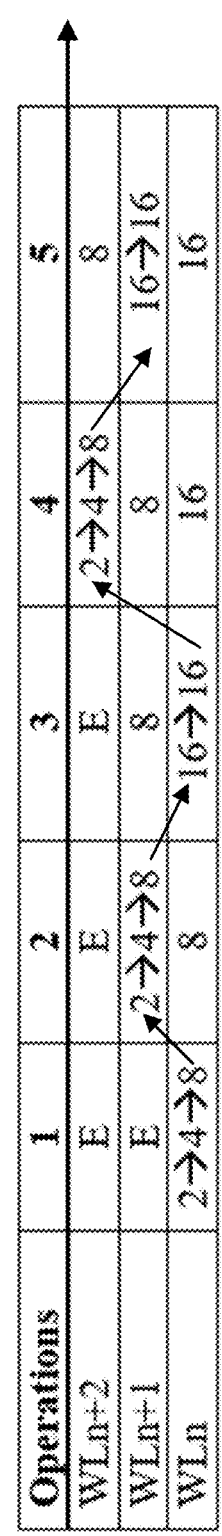

FIGS. 9B-9D are graphs illustrating consecutive programming operations that includes the consecutive coarse programming followed by fine programing of a set of threshold voltage distributions associated with the alternative programming sequences of FIG. 9A according to various embodiments. For example, the graph of FIG. 9B corresponds to the first programming sequence extension (2-8-16/16) illustrated at right in FIG. 9A. Thus, this embodiment is similar to that of FIG. 6, except that instead of a single operation to program TLC threshold voltage distributions, an SLC threshold voltage distribution is first programmed followed by programming the TLC threshold voltage distributions to each same set of memory cells. Later the same set of memory cells is coarse programmed with an intermediate set of QLC memory cells and then fine programmed with a final set of QLC threshold voltage distributions.

Further, FIG. 9C corresponds to the second programming sequence extension (4-16/16) illustrated in the middle in FIG. 9A. Thus, this embodiment is similar to that of FIG. 6, except instead of initially programming each set of memory cells with TLC threshold voltage distributions, each set of memory cells is programmed with MLC threshold voltage distributions before performing the consecutive coarse and fine programming of each set of memory cells.

Additionally, FIG. 9D corresponds to the third programming sequence extension (2-4-8-16/16) at the right in FIG. 9A. This embodiment is like a combination of the embodiments of the first two programming sequence extensions. Namely, at a first operation, the processing logic causes a first set of memory cells associated with the first wordline (WLn) to be programmed from an erase distribution to an SLC set of threshold voltage distributions. The processing logic, also during the first operation, causes the first set of memory cells to next be programmed with an MLC set of threshold voltage distributions, followed by a further programming of the set of memory cells with a TLC set of threshold voltage distributions.

At a second operation, the processing logic causes a second set of memory cells, associated with the second wordline (WLn+1) that is adjacent to the first wordline (WLn), to also be programmed from an erase distribution first to an SLC set of threshold voltage distributions, to an MLC set of threshold voltage distributions, then to a TLC set of threshold voltage distributions. In this way, by gradually programming adjacent memory cells to the TLC set of Vt distributions, adjacent memory cells incur less cell-to-cell interference.

The third operation is otherwise the same as was discussed with reference to FIG. 6 in performing a consecutive coarse programming of the first set of memory cells with an intermediate set of QLC threshold voltage distributions followed by a fine programming of the first set of memory cells with a final set of QLC threshold voltage distributions. The operations continue as explained before with reference to FIG. 6, except that each adjacent cell that is programmed from the erased state is progressively programmed with an SLC, then an MLC, followed by a TLC set of threshold voltage distributions.

Figure 10:
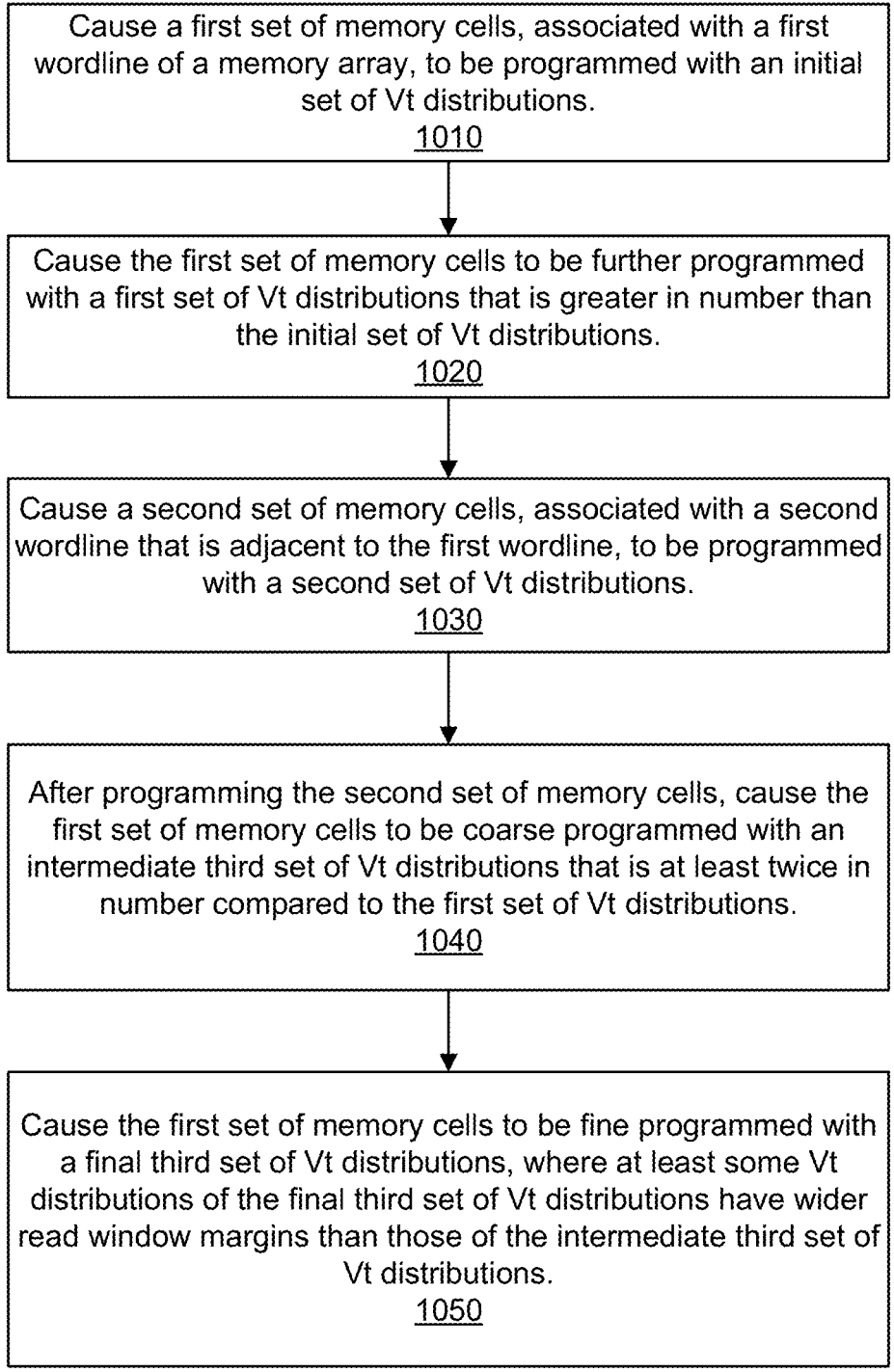
FIG. 10 is a flow diagram of an example method of multiple initial programming operations followed by consecutive coarse and fine programming of a set of threshold voltage distributions according to various embodiments.

FIG. 10 is a flow diagram of an example method 1000 of multiple initial programming operations followed by consecutive coarse and fine programming of a set of threshold voltage distributions according to various embodiments. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by the local media controller 135 (e.g., control logic) of FIGS. 1A-1B, e.g., by the CF programmer 137, on a memory array that includes a plurality of memory cells electrically coupled to a plurality of wordlines and a plurality of bitlines. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1010, a first set of memory cells is programmed. More specifically, the processing logic causes a first set of memory cells, associated with a first wordline of a memory array, to be programmed with an initial set of threshold voltage distributions.

At operation 1020, the first set of memory cells is further programmed. More specifically, the processing logic causes the first set of memory cells to be further programmed with a first set of threshold voltage distributions that is greater in number than the initial set of threshold voltage distributions.

At operation 1030, a second set of memory cells is programmed. More specifically, the processing logic causes a second set of memory cells, associated with a second wordline that is adjacent to the first wordline, to be programmed with a second set of threshold voltage distributions.

At operation 1040, a further coarse programming is performed on the first set of memory cells. More specifically, after programming the second set of memory cells, the processing logic causes the first set of memory cells to be coarse programmed with an intermediate third set of threshold voltage distributions that is at least twice in number compared to the first set of threshold voltage distributions.

At operation 1050, a fine programming is performed on the first set of memory cells. More specifically, the processing logic causes the first set of memory cells to be fine programmed with a final third set of threshold voltage distributions, where at least some threshold voltage distributions of the final third set of threshold voltage distributions have wider read window margins than those of the intermediate third set of threshold voltage distributions. Further, at least some of the final third set of Vt distributions may also be shifted to higher threshold voltage ranges compared to those of the intermediate third set of Vt distributions.

Figures 11A, 11B:
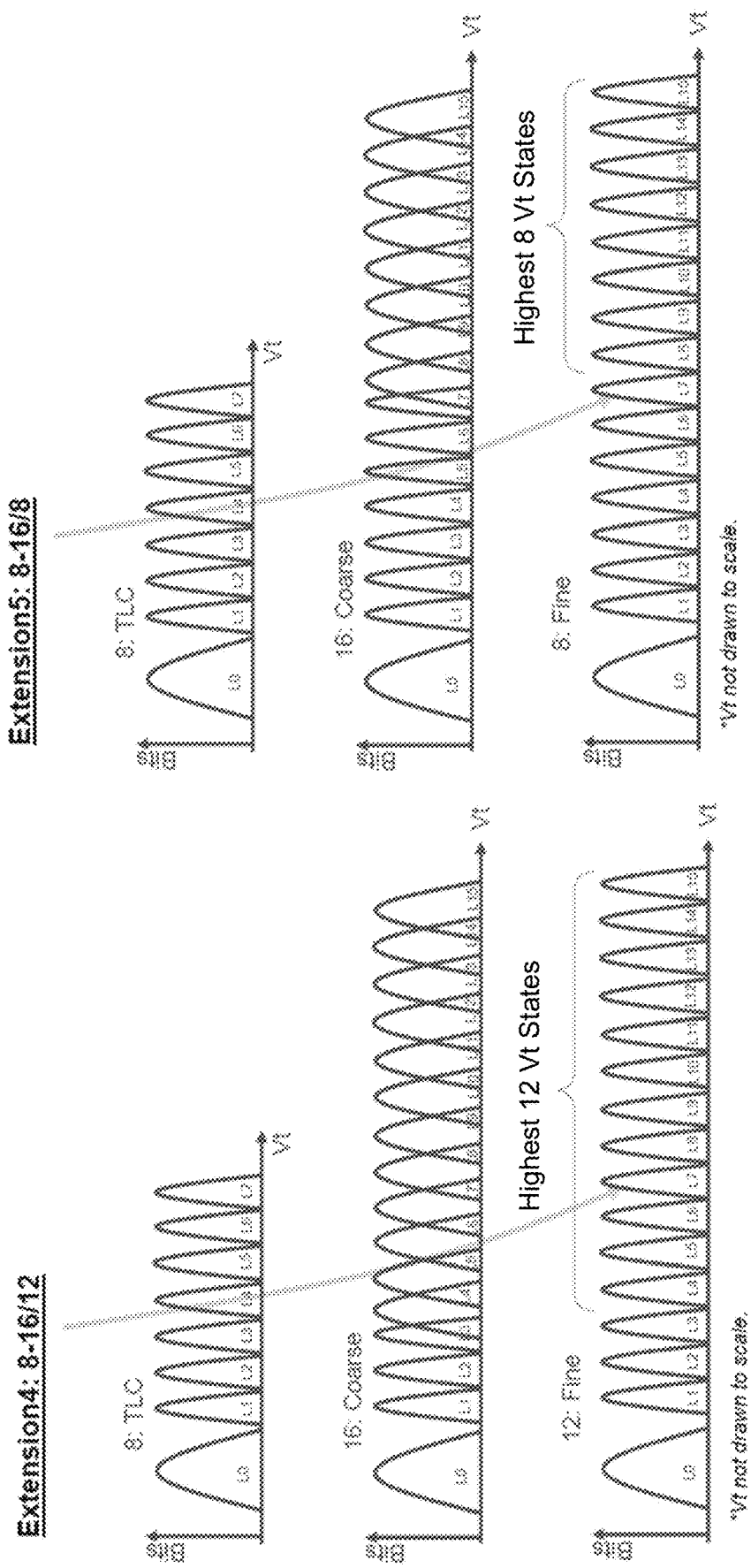
FIGS. 11A-11B are a set of graphs illustrating alternative programming sequences in which the final fine programming is of only some of the highest threshold voltage distributions of the set of threshold voltage distributions according to various embodiments.

FIGS. 11A-11B are a set of graphs illustrating alternative programming sequences in which the final fine programming is of only some of the highest threshold voltage distributions of the set of threshold voltage distributions according to various embodiments. In other words, in at least some embodiments, causing the first set of memory cells to be fine programmed includes causing only multiple of the highest threshold voltage distributions of the intermediate third set of threshold voltage distributions to be fine programmed to program the final third set of Vt distributions. Following the previously discussed examples herein, this final third set of threshold voltage distributions can be QLC threshold voltage distributions. Because the read window margin generally suffers the most at highest Vt levels, the processing (or control) logic can stop short of fine programming all of the third set of threshold distributions. By way of example, the processing logic might only cause the highest 12 Vt distributions (FIG. 11A) or the highest 8 Vt distributions (FIG. 11B) or the like to be fine programmed. In this way, the modified coarse-fine programming of the present disclosure can reduce the program time while still retaining acceptable read window margins in the lowest Vt distributions of the first set of voltage distributions.

Figure 12:
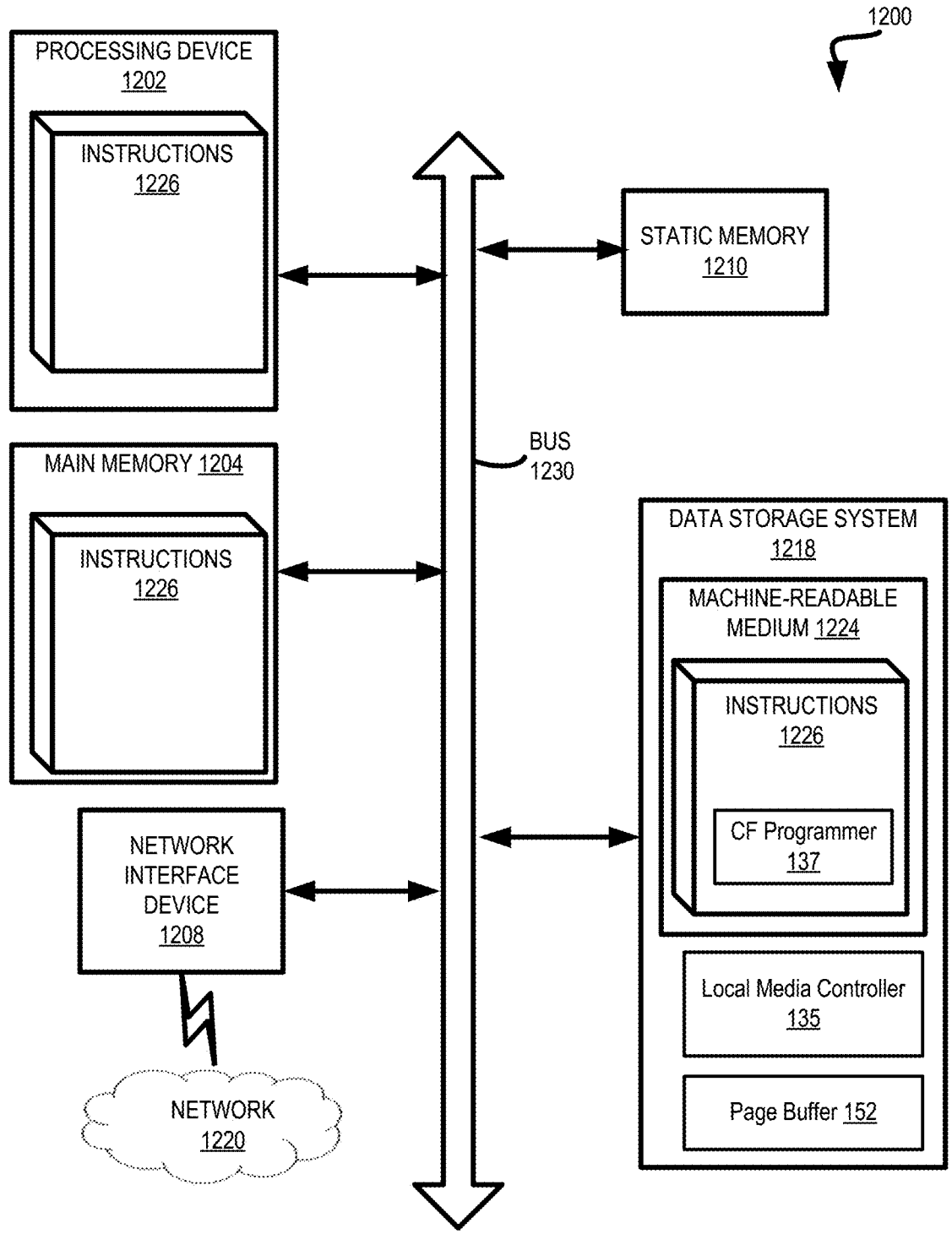
FIG. 12 is a block diagram of an example computer system in which embodiments of the present disclosure can operate.

FIG. 12 illustrates an example machine of a computer system 1200 within which a set of instructions, for causing the machine to perform any one or more of the methodologies discussed herein, can be executed. In some embodiments, the computer system 1200 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the memory sub-system controller 115 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM) or Rambus DRAM (RDRAM), etc.), a static memory 1210 (e.g., flash memory, static random access memory (SRAM), etc.), and a data storage system 1218, which communicate with each other via a bus 1230.

Processing device 1202 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 can also be one or more special-purpose processing devices such as an application specific integrated circuit (ASIC), a field programmable gate array (FPGA), a digital signal processor (DSP), network processor, or the like. The processing device 1202 is configured to execute instructions 1228 for performing the operations and steps discussed herein. The computer system 1200 can further include a network interface device 1212 to communicate over the network 1220.

The data storage system 1218 can include a machine-readable storage medium 1224 (also known as a non-transitory computer-readable storage medium) on which is stored one or more sets of instructions 1226 or software embodying any one or more of the methodologies or functions described herein, including those associated with the CF programmer 137. The data storage system 1218 can further include the local media controller 135 and the page buffer 152 that were previously discussed. The instructions 1228 can also reside, completely or at least partially, within the main memory 1204 and/or within the processing device 1202 during execution thereof by the computer system 1200, the main memory 1204 and the processing device 1202 also constituting machine-readable storage media. The machine-readable storage medium 1224, data storage system 1218, and/or main memory 1204 can correspond to the memory sub-system 110 of FIG. 1A.

In one embodiment, the instructions 1226 include instructions to implement functionality corresponding to a controller (e.g., the memory sub-system controller 115 of FIG. 1A). While the machine-readable storage medium 1224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
    a memory array comprising memory cells and wordlines; and
    control logic operatively coupled with the memory array, the control logic to perform operations comprising:
        causing a first set of memory cells, associated with a first wordline of the memory array, to be programmed with a first set of threshold voltage distributions;
        causing a second set of memory cells, associated with a second wordline that is adjacent to the first wordline, to be programmed with a second set of threshold voltage distributions;

after programming the second set of memory cells, causing the first set of memory cells to be coarse programmed with an intermediate third set of threshold voltage distributions that is at least twice in number compared to the first set of threshold voltage distributions; and causing the first set of memory cells to be fine programmed with a final third set of threshold voltage distributions, wherein at least some threshold voltage distributions of the final third set of threshold voltage distributions comprise wider read window margins than those of the intermediate third set of threshold voltage distributions.

2. The memory device of claim 1, wherein the first set of threshold voltage distributions comprises one of multi-level cell (MLC) or triple-level cell (TLC) threshold voltage distributions.

3. The memory device of claim 1, wherein the final third set of threshold voltage distributions comprises quad-level cell (QLC) threshold voltage distributions.

4. The memory device of claim 1, wherein the operations further comprise causing the first set of memory cells to be programmed with an initial set of threshold voltage distributions before causing the first set of memory cells to be programmed with the first set of threshold voltage distributions.

5. The memory device of claim 4, wherein the initial set of threshold voltage distributions comprises at least one of a set of single-level cell (SLC) threshold voltage distributions or a set of multi-level cell (MLC) threshold voltage distributions.

6. The memory device of claim 1, wherein causing the first set of memory cells to be fine programmed comprises causing only a plurality of highest threshold voltage distributions of the intermediate third set of threshold voltage distributions to be fine programmed to the final third set of threshold voltage distributions.

7. The memory device of claim 1, wherein the operations further comprise:
after causing the first set of memory cells to be fine programmed, causing a third set of memory cells, associated with a third wordline that is adjacent to the second wordline, to be programmed with a fourth set of threshold voltage distributions;
after programming the third set of memory cells, causing the second set of memory cells to be coarse programmed with an intermediate fifth set of threshold voltage distributions that is at least twice in number compared to the second set of threshold voltage distributions; and
causing the second set of memory cells to be fine programmed with a final fifth set of threshold voltage distributions, wherein at least some threshold voltage distributions of the final fifth set of threshold voltage distributions comprise wider read window margins than those of the intermediate fifth set of threshold voltage distributions.

8. A method comprising:
causing a first set of memory cells, associated with a first wordline of a memory array, to be programmed with a first set of threshold voltage distributions;
causing a second set of memory cells, associated with a second wordline that is adjacent to the first wordline, to be programmed with a second set of threshold voltage distributions;
after programming the second set of memory cells, causing the first set of memory cells to be coarse programmed with an intermediate third set of threshold voltage distributions that is at least twice in number compared to the first set of threshold voltage distributions; and causing the first set of memory cells to be fine programmed with a final third set of threshold voltage distributions, wherein at least some threshold voltage distributions of the final third set of threshold voltage distributions comprise wider read window margins than those of the intermediate third set of threshold voltage distributions.

9. The method of claim 8, wherein the first set of threshold voltage distributions comprises one of multi-level cell (MLC) or triple-level cell (TLC) threshold voltage distributions.

10. The method of claim 8, wherein the final third set of threshold voltage distributions comprises quad-level cell (QLC) threshold voltage distributions.

11. The method of claim 8, further comprising causing the first set of memory cells to be programmed with an initial set of threshold voltage distributions before causing the first set of memory cells to be programmed with the first set of threshold voltage distributions.

12. The method of claim 11, wherein the initial set of threshold voltage distributions comprises at least one of a set of single-level cell (SLC) threshold voltage distributions or a set of multi-level cell (MLC) threshold voltage distributions.

13. The method of claim 8, wherein causing the first set of memory cells to be fine programmed comprises causing only a plurality of highest threshold voltage distributions of the intermediate third set of threshold voltage distributions to be fine programmed to the final third set of threshold voltage distributions.

14. The method of claim 8, further comprising:
after causing the first set of memory cells to be fine programmed, causing a third set of memory cells, associated with a third wordline that is adjacent to the second wordline, to be programmed with a fourth set of threshold voltage distributions;
after programming the third set of memory cells, causing the second set of memory cells to be coarse programmed with an intermediate fifth set of threshold voltage distributions that is at least twice in number compared to the second set of threshold voltage distributions; and
causing the second set of memory cells to be fine programmed with a final fifth set of threshold voltage distributions, wherein at least some threshold voltage distributions of the final fifth set of threshold voltage distributions comprise wider read window margins than those of the intermediate fifth set of threshold voltage distributions.

15. A method comprising:
causing a first set of memory cells, associated with a first wordline of a memory array, to be programmed with an initial set of threshold voltage distributions;
causing the first set of memory cells to be further programmed with a first set of threshold voltage distributions that is greater in number than the initial set of threshold voltage distributions;
causing a second set of memory cells, associated with a second wordline that is adjacent to the first wordline, to be programmed with a second set of threshold voltage distributions;
after programming the second set of memory cells, causing the first set of memory cells to be coarse programmed with an intermediate third set of threshold voltage distributions that is at least twice in number compared to the first set of threshold voltage distributions; and causing the first set of memory cells to be fine programmed with a final third set of threshold voltage distributions, wherein at least some threshold voltage distributions of the final third set of threshold voltage distributions comprise wider read window margins than those of the intermediate third set of threshold voltage distributions.

16. The method of claim 15, wherein causing the first set of memory cells to be programmed with the initial set of threshold voltage distributions comprises at least one of:

causing the first set of memory cells to be programmed with a set of single-level cell (SLC) threshold voltage distributions;

causing the first set of memory cells to be programmed with a set of multi-level cell (MLC) threshold voltage distributions; or causing the first set of memory cells to be programmed with a set of triple-level cell (TLC) threshold voltage distributions.

17. The method of claim 15, wherein the first set of threshold voltage distributions comprises one of multi-level cell (MLC) or triple-level cell (TLC) threshold voltage distributions.

18. The method of claim 15, wherein the final third set of threshold voltage distributions comprises quad-level cell (QLC) threshold voltage distributions.

19. The method of claim 15, wherein causing the first set of memory cells to be fine programmed comprises causing only a plurality of highest threshold voltage distributions of the intermediate third set of threshold voltage distributions to be fine programmed to the final third set of threshold voltage distributions.

20. The method of claim 15, further comprising:

after causing the first set of memory cells to be fine programmed, causing a third set of memory cells, associated with a third wordline that is adjacent to the second wordline, to be programmed with a fourth set of threshold voltage distributions;

after programming the third set of memory cells, causing the second set of memory cells to be coarse programmed with an intermediate fifth set of threshold voltage distributions that is at least twice in number compared to the second set of threshold voltage distributions; and causing the second set of memory cells to be fine programmed with a final fifth set of threshold voltage distributions, wherein at least some threshold voltage distributions of the final fifth set of threshold voltage distributions comprise wider read window margins than those of the intermediate fifth set of threshold voltage distributions.

* * * * *